US009666124B2

(12) United States Patent

Lim et al.

(10) Patent No.: US 9,666,124 B2

(45) Date of Patent: May 30, 2017

(54) PIXEL AND ORGANIC LIGHT EMITTING DISPLAY DEVICE USING THE SAME

(71) Applicant: SAMSUNG DISPLAY CO., LTD., Yongin, Gyeonggi-Do (KR)

(72) Inventors: Hwa-Su Lim, Yongin (KR); Jong-Heon Han, Yongin (KR)

(73) Assignee: SAMSUNG DISPLAY CO., LTD., Yongin, Gyeonggi-Do (KR)

(*) Notice: Subject to any disclaimer, the term of this patent is extended or adjusted under 35 U.S.C. 154(b) by 81 days.

(21) Appl. No.: 14/478,080

(22) Filed: Sep. 5, 2014

(65) Prior Publication Data

US 2015/0070408 A1 Mar. 12, 2015

(30) Foreign Application Priority Data

Sep. 10, 2013 (KR) ........................ 10-2013-0108474

(51) Int. Cl.

*G09G 3/32* (2016.01)
*H01L 27/32* (2006.01)
*G09G 3/3233* (2016.01)

(52) U.S. Cl.

CPC ... *G09G 3/3233* (2013.01); *G09G 2300/0852* (2013.01); *G09G 2300/0861* (2013.01)

(58) Field of Classification Search

CPC ..................... G09G 3/3233; G09G 2300/0861
See application file for complete search history.

(56) References Cited

U.S. PATENT DOCUMENTS

2006/0187153 A1* 8/2006 Nathan ................ G09G 3/3233 345/76
2007/0075937 A1* 4/2007 Kim ..................... G09G 3/3233 345/76
2008/0088549 A1* 4/2008 Nathan ................ G09G 3/3233 345/80
2008/0111804 A1* 5/2008 Choi .................... G09G 3/3233 345/205
2010/0177024 A1* 7/2010 Choi .................... G09G 3/3233 345/76
2011/0115835 A1* 5/2011 Lee ...................... G09G 3/3233 345/691
2011/0285691 A1 11/2011 Takasugi et al.
2011/0304593 A1* 12/2011 Huang ................. G09G 3/3225 345/204
2012/0169574 A1* 7/2012 Kim ..................... G09G 3/3233 345/76

(Continued)

FOREIGN PATENT DOCUMENTS

JP WO 2014/002101 * 2/2014 ............... G09G 3/30
KR 10-2012-0074422 A 7/2012
KR 10-2012-0138924 A 12/2012

*Primary Examiner* — Lin Li

(74) *Attorney, Agent, or Firm* — Lee & Morse P.C.

(57) ABSTRACT

A pixel includes a pixel circuit to control an amount of current supplied from a first power source to an organic light emitting diode (OLED) based on a data signal. At least one first transistor is located in a current path between the first power source and OLED. A second transistor is coupled between a gate electrode of the at least one first transistor and an emission control line through which an emission control signal is supplied. The emission control line controls a state of the at least one first transistor, and the second transistor turns on or off based on the data signal.

16 Claims, 3 Drawing Sheets

(56) References Cited

U.S. PATENT DOCUMENTS

| | | | | |
|---|---|---|---|---|
| 2012/0199854 | A1* | 8/2012 | Noguchi | H01L 27/3276 257/88 |
| 2013/0093652 | A1* | 4/2013 | Kim | G09G 3/3233 345/77 |
| 2013/0201172 | A1* | 8/2013 | Jeong | G09G 3/3233 345/212 |
| 2014/0028648 | A1* | 1/2014 | Park | G09G 3/3233 345/211 |
| 2014/0035799 | A1* | 2/2014 | Bae | G09G 3/3266 345/82 |
| 2015/0084842 | A1* | 3/2015 | Kim | G09G 3/3233 345/76 |
| 2015/0161944 | A1* | 6/2015 | Gai | G09G 3/3258 345/78 |

* cited by examiner

PIXEL AND ORGANIC LIGHT EMITTING DISPLAY DEVICE USING THE SAME

CROSS-REFERENCE TO RELATED APPLICATION

Korean Patent Application No. 10-2013-0108474, filed on Sep. 10, 2013, and entitled, "Pixel and Organic Light Emitting Display Device Using the Same," is incorporated by reference herein in its entirety.

BACKGROUND

1. Field

One or more embodiments described herein relate to a pixel and a display device.

2. Description of the Related Art

A variety of flat panels displays have been developed. Examples include liquid crystal displays, organic light emitting displays, and a plasma display panels. An organic light emitting display generates images using organic light emitting diodes that emit light based on a recombination of electrons and holes in an active layer. These displays have fast response speeds and operate with low power consumption.

SUMMARY

In accordance with one embodiment, a pixel includes an organic light emitting diode (OLED); a pixel circuit configured to control an amount of current supplied from a first power source to the OLED based on a data signal; at least one first transistor in a current path between the first power source and OLED; and a second transistor coupled between a gate electrode of the at least one first transistor and an emission control line through which an emission control signal is supplied, wherein the emission control line controls a state of the at least one first transistor and wherein the second transistor turns on or off based on the data signal.

The pixel may include a first capacitor between the gate electrode of the at least one first transistor and the first power source. The at least one first transistor may include a plurality of transistors including a primary first transistor coupled between the first power source and the pixel circuit and a secondary first transistor coupled between the pixel circuit and the OLED.

The second transistor may turn off when the data signal corresponds to a black gray scale value, and the second transistor may turn on when the data signal has a gray scale value different from a black gray scale value.

The pixel circuit may include third, fourth, fifth, and sixth transistors. The third transistor is provided in the current path between the first power source and the OLED, the third transistor controlling the amount of current supplied to the OLED based on a voltage applied to a first node. The fourth transistor is coupled between a first electrode of the third transistor and a data line, the fourth transistor to turn on when a scan signal is supplied to a first scan line. The fifth transistor is coupled between a second electrode of the third transistor and the first node, the fifth transistor to turn on when the scan signal is supplied to the first scan line. The sixth transistor is coupled between the first node and an initialization power source, the sixth transistor to turn on when a scan signal is supplied to a second scan line, and wherein the pixel circuit includes a second capacitor coupled between the first node and the first power source.

A gate electrode of the second transistor may be coupled to the first node. The initialization power source may be set to a voltage lower than the data signal. The emission control signal may overlap the scan signals supplied to the first and second scan lines.

In accordance with another embodiment, an organic light emitting display device includes a scan driver configured to supply a scan signal to scan lines and to supply an emission control signal to emission control lines; a data driver configured to supply data signals to respective data lines synchronized with the scan signals; and a plurality of pixels in an area defined by the scan, emission control, and data lines.

Each pixel positioned on an i-th horizontal line includes an organic light emitting diode (OLED); a pixel circuit configured to control an amount of current supplied to a first power source to the OLED based on a respective one of the data signals; at least one first transistor in a current path from the first power source to the OLED; and a second transistor coupled between an i-th emission control line and a gate electrode of the at least one first transistor, wherein the second transistor is to be turned on or off based on the respective one of the data signals.

The scan signal may be set to a voltage at which the transistors in the pixel are turned on, and the emission control signal may be set to a voltage at which the transistors in the pixel are turned off. A first capacitor may be coupled between the gate electrode of the at least one first transistor and the first power source.

The at least one first transistor may include a plurality of transistors, which includes a primary first transistor coupled between the first power source and the pixel circuit; and a secondary first transistor coupled between the pixel circuit and OLED.

The second transistor may turn off when the respective one of the data signals correspond to a black gray scale value, and the second transistor may turn on when the respective one of the data signals corresponds to a gray scale value different from the black gray scale value. The scan driver may supply the emission control signal to the i-th emission control line to overlap scan signals supplied to (i−1)-th and i-th scan lines.

The pixel circuit may include a third transistor in the current path between the first power source and OLED, the third transistor to control the amount of current supplied to the OLED based on a voltage applied to a first node; a fourth transistor coupled between a first electrode of the third transistor and a data line, the fourth transistor to turn on when the scan signal is supplied to the i-th scan line; a fifth transistor coupled between a second electrode of the third transistor and the first node, the fifth transistor to turn on when the scan signal is supplied to the i-th scan line; a sixth transistor coupled between the first node and an initialization power source, the sixth transistor to turn on when the scan signal is supplied to the (i−1)-th scan line; and a second capacitor coupled between the first node and first power source.

A gate electrode of the second transistor may be coupled to the first node. The initialization power source may be set to a voltage lower than the data signal.

In accordance with another embodiment, a pixel control circuit includes a first switch; a second switch; and a third switch coupled to the first and second switches, wherein the third switch is controlled by a data signal, wherein the third switch outputs a first signal to turn off the first and second switches when the data signal has a black gray scale value and outputs a second signal to turn on the first and second switches when the data signal has gray scale value different from a black gray scale value, and wherein the first and second switches are coupled between a power source and an organic light emitting diode. One or more of the first, second, or third switches may be transistors. The OLED may be in non-emission state when the data signal has a black gray scale value.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
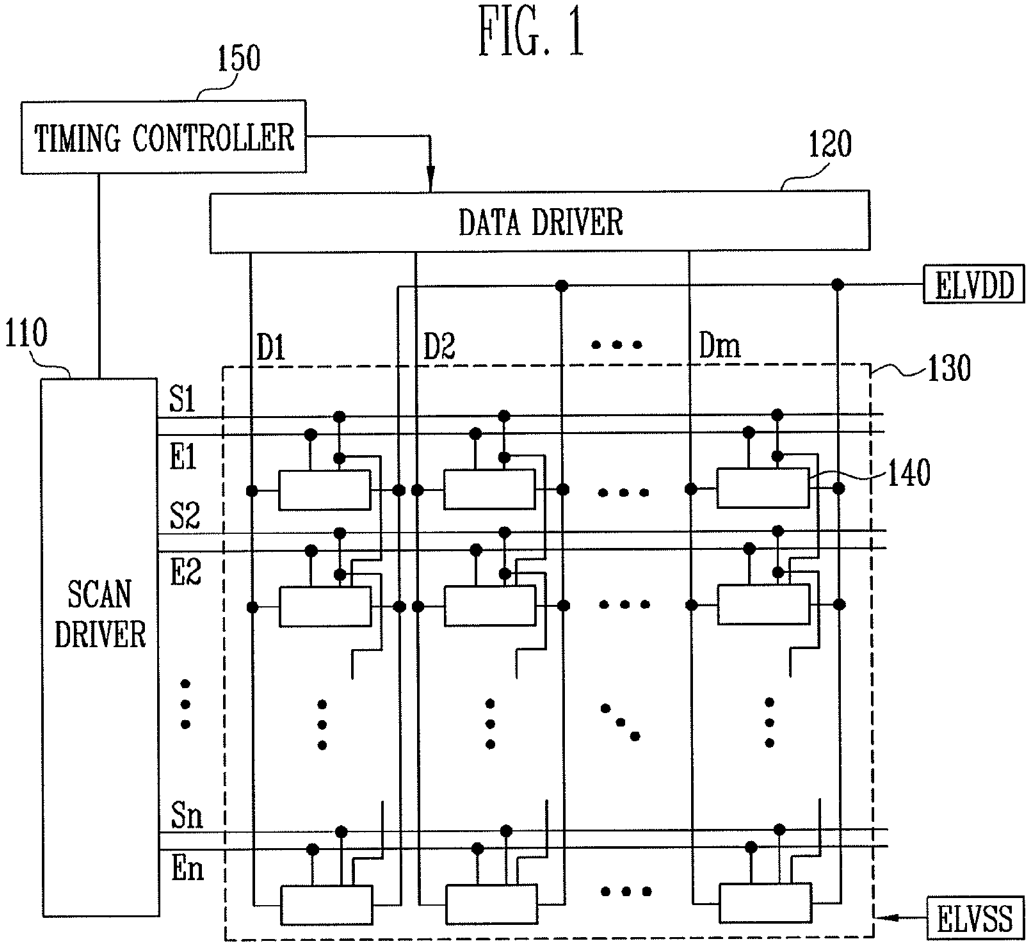
FIG. 1 illustrates an embodiment of an organic light emitting display device.

Example embodiments are described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

Hereinafter, certain exemplary embodiments are described with reference to the accompanying drawings. Here, when a first element is described as being coupled to a second element, the first element may be not only directly coupled to the second element but may also be indirectly coupled to the second element via a third element. Further, some of the elements that are not essential to the complete understanding of the invention are omitted for clarity. Also, like reference numerals refer to like elements throughout.

FIG. 1 illustrates an embodiment of an organic light emitting display device which includes a scan driver 110, a data driver 120, a pixel unit 130, and a timing controller 150. The pixel unit 130 has a plurality of pixels 140 in an area defined by scan lines S1 to Sn, emission control lines E1 to En, and data lines D1 to Dm. The scan driver 110 drives the scan lines S1 to Sn and emission control lines E1 to En. The data driver 120 drives data lines D1 to Dm. The timing controller 150 controls scan driver 110 and data driver 120.

The timing controller 150 realigns data supplied from an external source and supplies the realigned data to data driver 120.

The scan driver 110 generates a scan signal under control of timing controller 150, and supplies the generated scan signal to scan lines S1 to Sn. The scan driver 110 generates an emission control signal under control of the timing controller 150, and supplies the generated emission control signal to emission control lines E1 to En. In one embodiment, the width of the emission control signal is equal to or wider than that of the scan signal. The emission control signal supplied to an i-th emission control line Ei may overlap the scan signal supplied to (i−1)-th and i-th scan lines Si−1 and Si.

The scan signal may be set to a voltage (e.g., a low voltage) at which transistors in the pixels 140 turn on. The emission control signal may be set to a voltage (e.g., a high voltage) at which the transistors in pixels 140 turn off. The low voltage at which the transistors in the pixels 140 turn on is supplied to emission control lines E1 to En during a period in which the emission control signal is not supplied.

The data driver 120 generates a data signal under control of the timing controller 150, and supplies the generated data signal to data lines D1 to Dm. The data signal supplied to the data lines D1 to Dm may be supplied to be synchronized with the scan signal supplied to a scan line (any one of scan lines S1 to Sn).

The data signals supplied from the data driver 120 may be set to various voltage values corresponding to gray scale values. The data signal corresponding to a black gray scale value may be set to a voltage at which the transistors in the pixels 140 turn off. The data signal corresponding to a gray scale value, except the black gray scale value, may be set to a voltage at which the transistors in the pixels 140 turn on.

In one example implementation, the voltage difference between a data signal corresponding to the black gray scale value and a data signal corresponding to gray scale value of 1 may be set to about 0.5V. However, under some circumstances, it may be difficult to confirm the turn-on and turn-off states of the transistors at a low voltage difference of about 0.5V.

In accordance with one embodiment, the voltage difference between a data signal corresponding to the black gray scale value and a data signal corresponding to a gray scale value of 1 may be a predetermined voltage difference, e.g., a voltage difference of about 2V or more. Then, the turn-on and turn-off states of the transistors can be clearly determined to correspond to the data signal of the black gray scale value and the data signal of the gray scale value of 1.

Additionally, in one embodiment, the voltage difference between the data signal of the black gray scale value and the data signal of the gray scale value of 1 may be variously set based on a process condition, a process variation, etc. Nevertheless, the data signal of the black gray scale value is to be set to a voltage at which the transistors turn off, and the data signal of the gray scale value of 1 is to be set to a voltage at which the transistors turn on. This voltage difference may exist between other adjacent gray scale values, and in some embodiments throughout the entire range of expressible gray scale values.

The pixel unit 130 includes the pixels 140 positioned in the area defined by the scan lines S1 to Sn, the data lines D1 to Dm, and the emission control lines E1 to En. The pixels 140 receive a first power source ELVDD and a second power source ELVSS. The second power source ELVSS may be set to a voltage lower than the first power source ELVDD. These voltage sources may be externally supplied. Each pixel 140 generates light with a luminance based on a controlled amount of current flowing from the first power source ELVDD to the second power source ELVSS, via an organic light emitting diode, corresponding to the data signal.

Each pixel 140 is coupled to a respective one of the emission control lines E1 to En. Each pixel 140 may be implemented with various types of circuits, which set the pixel to a non-emission state when the emission control signal is supplied to the emission control line. For example, each pixel 140 positioned on an i-th horizontal line may be coupled to the (i−1)-th and i-th scan lines Si−1 and Si. In this case, a zeroth scan line may be additionally formed to be coupled to the pixels 140 positioned on a first horizontal line.

Figure 2:
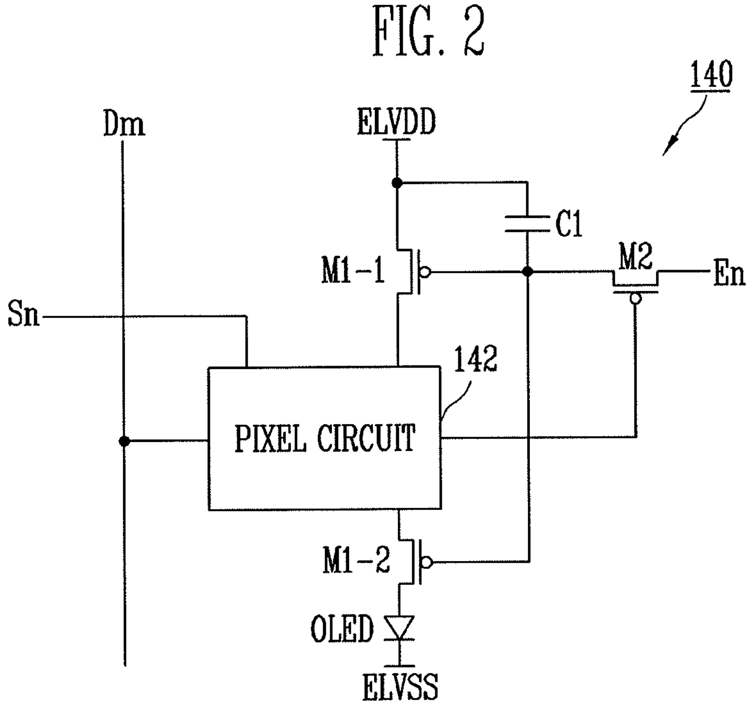
FIG. 2 illustrates an embodiment of a pixel.

FIG. 2 illustrates a diagram illustrating a pixel, which, for example, may be the pixels 140 in FIG. 1. For convenience of illustration, the pixel 140 is shown as being coupled to an m-th data line Dm and an n-th scan line Sn.

Referring to FIG. 2, the pixel 140 includes an organic light emitting diode (OLED), a pixel circuit 142 to control the amount of current supplied to the OLED, one or more first transistors M1-1 and M1-2 positioned in a current path between the first power source ELVDD and second power source ELVSS, a second transistor M2 between gate electrodes of first transistors M1-1 and M1-2 and emission control line En, and a first capacitor C1 coupled between the gate electrodes of first transistors M1-1 and M1-2 and first power source ELVDD.

The OLED is positioned in the current path between the first power source ELVDD and second power source ELVSS. The OLED generates light with a luminance based on amount of current supplied from the pixel circuit 142.

The pixel circuit 142 is positioned in the current path between the first power source ELVDD and the second power source ELVSS. When a scan signal is supplied to scan line Sn, the pixel circuit 142 receives a data signal from data line Dm and stores the received data signal. The pixel circuit 142 storing the data signal controls the amount of the current supplied to the OLED. The pixel circuit 142 may be implemented with various types of circuits.

The first transistors M1-1 and M1-2 are positioned in the current path between the first power source ELVDD and the second power source ELVSS. The first transistors M1-1 and M1-2 may be turned off when an emission control signal is supplied to the emission control line En, and may be turned on when the emission control signal is not supplied.

The second transistor M2 is coupled between the gate electrodes of the first transistors M1-1 and M1-2 and the emission control line En. The second transistor M2 is turned on or turned off corresponding to the data signal stored in pixel circuit 142. For example, the second transistor M2 is set to a turn-on state when the data signal of a black gray scale value is stored in the pixel circuit 142, and is set to a turn-on state when a data signal corresponding to a gray scale value different from the black gray scale value is stored in the pixel circuit 142.

The first capacitor C1 is coupled between the gate electrodes of the first transistors M1-1 and M1-2 and the first power source ELVDD. The first capacitor C1 charges to a predetermined voltage.

Figure 3:
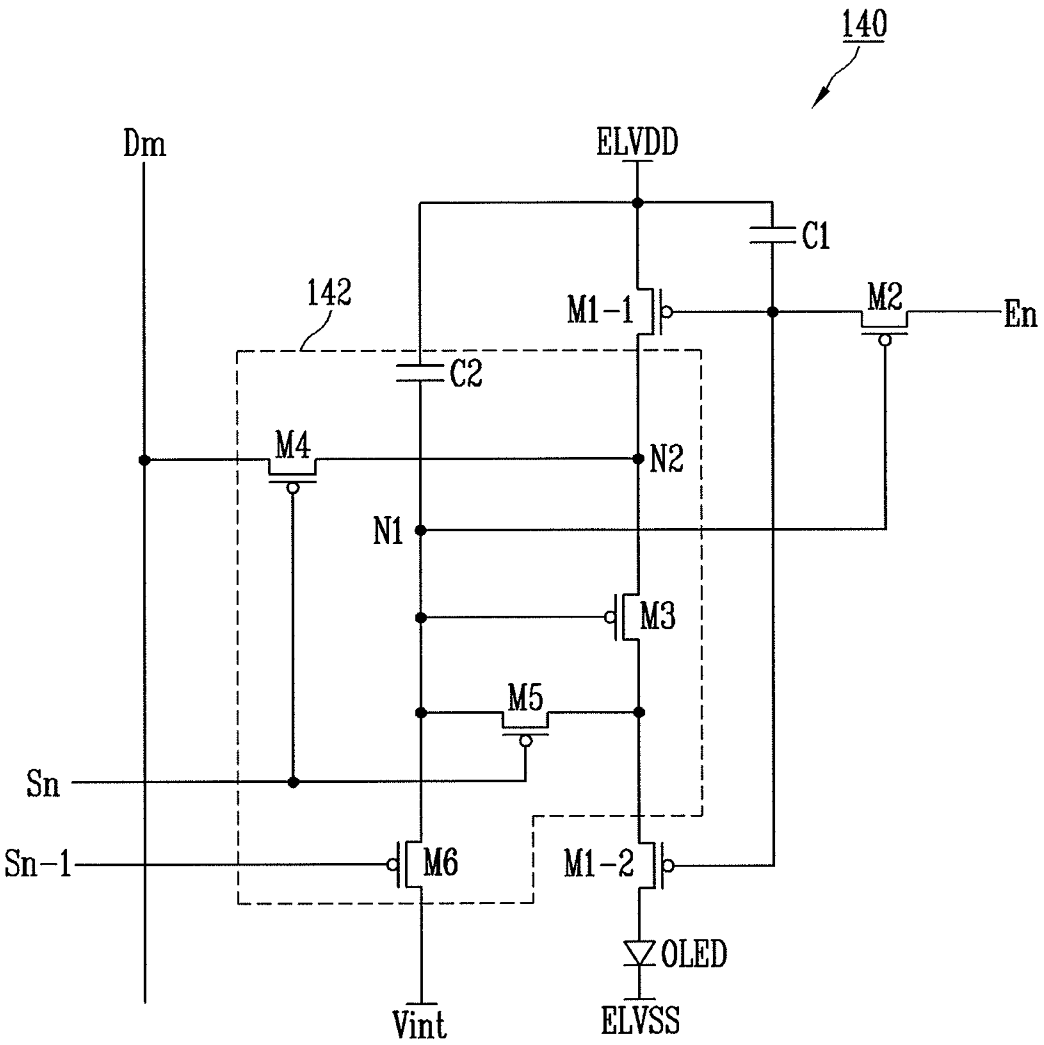
FIG. 3 illustrates an embodiment of a pixel circuit.

FIG. 3 illustrates an embodiment of the pixel circuit in FIG. 2. In FIG. 3, the pixel circuit 142 includes third to sixth transistors M3 to M6 and a second capacitor C2.

A first electrode of the fourth transistor M4 is coupled to data line Dm, and a second electrode of the fourth transistor M4 is coupled to a second node N2. A gate electrode of the fourth transistor M4 is coupled to scan line Sn. The fourth transistor M4 is turned on when the scan signal is supplied to the n-th scan line Sn, to supply the data signal supplied from the data line Dm to the second node N2. The second node N2 may be a node coupled to the first power source ELVDD, via primary first transistor M1-1.

A first electrode of the third transistor (e.g., a driving transistor) M3 is coupled to the second node N2. A second electrode of the third transistor M3 is coupled to an anode electrode of the OLED, via secondary first transistor M1-2. A gate electrode of the third transistor M3 is coupled to a first node N1. The third transistor M3 controls the amount of current flowing from the first power source ELVDD to the second power source ELVSS, via the OLED, corresponding to a voltage applied to the first node N1.

A first electrode of fifth transistor M5 is coupled to the second electrode of the third transistor M3. A second electrode of fifth transistor M5 is coupled to the first node N1. A gate electrode of the fifth transistor M5 is coupled to the n-th scan line Sn. The fifth transistor M5 is turned on when the scan signal is supplied to the n-th scan line Sn, to allow the third transistor M3 to be diode-coupled.

A first electrode of the sixth transistor M6 is coupled to the first node N1. A second electrode of the sixth transistor M6 is coupled to an initialization power source Vint. A gate electrode of the sixth transistor M6 is coupled to an (n−1)-th scan line Sn−1. The sixth transistor M6 turns on when the scan signal is supplied to the (n−1)-th scan line Sn−1, to supply the voltage of the initialization power source Vint to first node N1. The initialization power source Vint may be set to a voltage lower than the data signal.

The second capacitor C2 is coupled between the first node N1 and first power source ELVDD. The second capacitor C2 stores a voltage corresponding to the data signal and the threshold voltage of the third transistor M3.

In one embodiment, the gate electrode of second transistor M2 is coupled to the first node N1. Thus, the second transistor M2 is turned on or turned off corresponding to the voltage of the first node N1.

Figure 4:
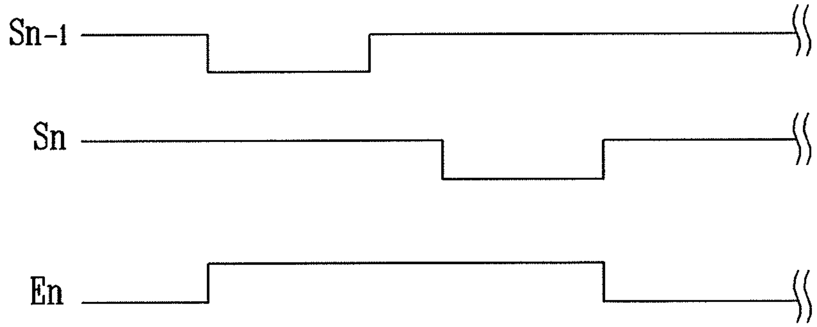
FIG. 4 illustrates an embodiment of a method for driving a pixel.

FIG. 4 illustrates an embodiment of a method for driving a pixel, which, for example, may be the pixel in FIG. 3. Referring to FIG. 4, the emission control signal is first supplied to emission control line En so that the first transistors M1-1 and M1-2 are turned off. In this case, the voltage of the emission control signal is stored in the first capacitor C1.

When the first transistors M1-1 and M1-2 turn off, the path of current flowing from the first power source ELVDD to second power source ELVSS, via the OLED, is electrically cut off. Therefore, the pixel 140 is set to a non-emission state during the period in which the emission control signal is supplied.

Subsequently, the scan signal is supplied to the (n−1)-th scan line Sn−1. When the scan signal is supplied to the (n−1)-th scan line Sn−1, the sixth transistor M6 is turned on. When the sixth transistor M6 turns on, the voltage of initialization power source Vint is supplied to the first node N1.

After the voltage of the initialization power source Vint is supplied to the first node N1, the scan signal is supplied to the n-th scan line Sn. When the scan signal is supplied to the n-th scan line Sn, the fourth and fifth transistors M4 and M5 turn on.

When the fifth transistor M4 turns on, the third transistor M3 is diode-coupled. When the fourth transistor M4 turns on, the data signal from data line Dm is supplied to the second node N2. In this case, the first node N1 is initialized with the voltage of the initialization power source Vint, which is lower than the data signal. As a result, the third transistor M3 turns on. When the third transistor M3 turns on, the voltage obtained by subtracting the threshold voltage of the third transistor M3 from the voltage of the data signal is applied to first node N1. The second capacitor C2 stores the voltage applied to the first node N1.

The second transistor M2 is set to the turn-on or turn-off state, based on the voltage applied to the first node N1 during the period in which the scan signal is supplied to the n-th scan line Sn. In other words, when the data signal corresponding to the black gray scale value is supplied to the first node N1, the second transistor M2 is set to the turn-off state. When a data signal corresponding to a gray scale value different from the black gray scale value is supplied, the second transistor M2 is set to the turn-on state.

After the voltage corresponding to the data signal is charged in the second capacitor C2, supply of the emission control signal to the emission control line En is stopped (e.g., a low voltage is supplied to emission control line En).

Figure 5A:
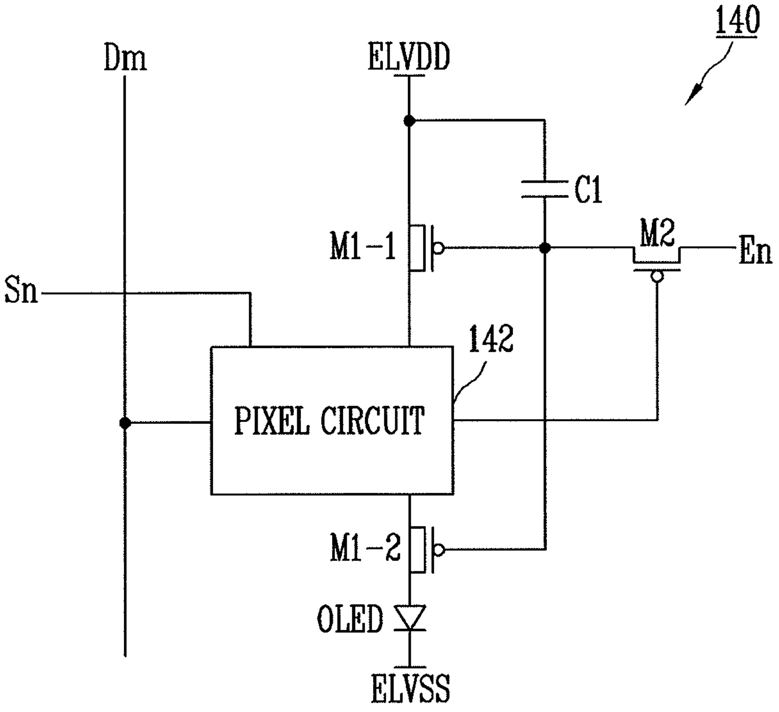
FIGS. 5A and 5B illustrate operating processes of a pixel.

When the second transistor M2 is set to the turn-on state, the low voltage which stops supply of the emission control signal is supplied to the gate electrodes of the first transistors M1-1 and M1-2. Accordingly, the first transistors M1-1 and M1-2 turn on. When the first transistors M1-1 and M1-2 turn on, the path of current flowing from the first power source ELVDD to the second power source ELVSS, via the OLED, is formed as shown in FIG. 5A.

In this case, the third transistor M3 controls the amount of current flowing from the first power source ELVDD to the OLED, corresponding to the voltage charged in the second capacitor C2. That is, when data signals corresponding to gray scale values other than the black gray scale value are supplied, the pixel 140 stably generates light with a luminance corresponding to a respective data signal.

When the data signal of the black gray scale value is supplied to the pixel 140, the second transistor M2 is set to the turn-off state, based on the voltage of the first node N1. When the second transistor M2 turns off, the low voltage supplied to the emission control line En, which stops supply of the emission control signal, is not supplied to the gate electrodes of the first transistors M1-1 and M1-2. Therefore, the first transistors M1-1 and M1-2 maintain a turn-off state based on the voltage of the emission control signal stored in the first capacitor C1.

Figure 5B:
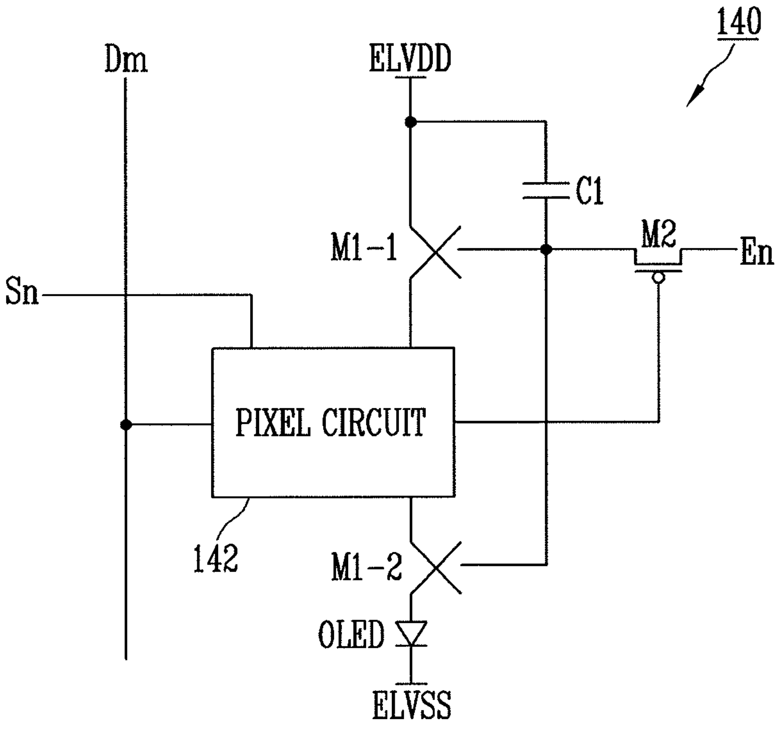

When the first transistors M1-1 and M1-2 maintain the turn-off state, the pixel circuit 142 is electrically decoupled from first power source ELVSS and OLED, as shown in FIG. 5B. Accordingly, the OLED is set to a non-emission state. Therefore, leakage current from the third transistor M3 is not supplied to the OLED corresponding to the data signal of the black gray scale value. Accordingly, it is possible to implement real black gray scale value and to thereby improve contrast ratio of the pixel.

The foregoing embodiments have been described using PMOS transistors. Alternative embodiments may be NMOS transistors, or a combination of PMOS and NMOS transistors.

In one embodiment, the OLED may emit red, green and blue light based on the amount of current supplied from the driving transistor. Alternatively, the OLED may generate white light based on the amount of the current supplied from the driving transistor. When the OLED generates white light, a color image may be implemented using one or more separate color filters.

By way of summation and review, an organic light emitting display device includes a data driver to drive data lines, a scan driver to drive scan lines and emission control lines, and pixels positioned in an area defined by the scan lines, emission control lines, and data lines. Each pixel generates light with a luminance based on an amount of current supplied from a driving transistor to an organic light emitting diode, based on a data signal.

In accordance with one or more of the aforementioned embodiments, when a black gray scale value is to be expressed, the driving transistor is electrically disconnected from the organic light emitting diode and/or first power source. This way, it is possible to prevent leakage current caused by the driving transistor to the organic light emitting diode. Accordingly, it is possible to improve the contrast ratio and to express real black scale values.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A pixel, comprising:

an organic light emitting diode (OLED);

a pixel circuit that controls an amount of current supplied from a first power source to the OLED based on a data signal;

at least one first transistor in a current path between the first power source and the OLED; and a second transistor coupled between a gate electrode of the at least one first transistor and an emission control line through which an emission control signal is supplied;

a gate electrode of the second transistor coupled to a first node, wherein:

the emission control signal controls a state of the at least one first transistor, and the second transistor turns on or off based on a voltage level of the first node, wherein when the second transistor is turned on, the emission control line is electrically connected to the gate electrode of the at least one first transistor through the second transistor being turned on, and wherein the pixel circuit includes third, fourth, and fifth transistors, the third transistor provided in the current path between the first power source and the OLED, the third transistor controlling the amount of current supplied to the OLED based on a voltage applied to the first node;

the fourth transistor coupled between a first electrode of the third transistor and a data line, the fourth transistor to turn on when a scan signal is supplied to a first scan line; and the fifth transistor coupled between a second electrode of the third transistor and the first node, the fifth transistor to turn on when the scan signal is supplied to the first scan line.

2. The pixel as claimed in claim 1, further comprising:

a first capacitor between the gate electrode of the at least one first transistor and the first power source, the first capacitor to store the emission control signal.

3. The pixel as claimed in claim 1, wherein the at least one first transistor includes a plurality of transistors including:

a primary first transistor coupled between the first power source and the pixel circuit; and a secondary first transistor coupled between the pixel circuit and the OLED.

4. The pixel as claimed in claim 1, wherein:

the second transistor turns off when the data signal corresponds to a black gray scale value, and the second transistor turns on when the data signal has a gray scale value different from the black gray scale value.

5. The pixel as claimed in claim 1, wherein the pixel circuit further a sixth transistor and a second capacitor, the sixth transistor coupled between the first node and an initialization power source, the sixth transistor to turn on when a scan signal is supplied to a second scan line, the second capacitor coupled between the first node and the first power source.

6. The pixel as claimed in claim 5, wherein the initialization power source is set to a voltage lower than the data signal.

7. The pixel as claimed in claim 5, wherein the emission control signal overlaps with the scan signals supplied to the first and second scan lines.

8. The pixel as claimed in claim 1, wherein the pixel circuit includes a driving transistor, the driving transistor to control the amount of current supplied from the first power source to the OILED according to a gate voltage of the driving transistor, the gate electrode of the driving transistor being determined by the voltage level of the first node, and wherein the second transistor is turned on/off according to the gate voltage of the driving transistor being determined by the voltage level of the first node.

9. An organic light emitting display device, comprising:

a scan driver that supplies a scan signal to scan lines and to supply an emission control signal to emission control lines;

a data driver that supplies data signals to respective data lines synchronized with the scan signals; and a plurality of pixels in an area defined by the scan lines, emission control lines, and data lines, wherein each pixel positioned on an i-th horizontal line includes: an organic light emitting diode (OLED);

a pixel circuit to control an amount of current supplied from a first power source to the OLED based on a respective one of the data signals;

at least one first transistor on a current path from the first power source to the OLED; and a second transistor coupled between an i-th emission control line supplying an i-th emission control signal and a gate electrode of the at least one first transistor, a gate electrode of the second transistor coupled to a first node, wherein the second transistor is to be turned on or off based on a voltage level of the first node, wherein when the second transistor is turned on, the i-th emission control line is electrically connected to the gate electrode of the at least one first transistor through the second transistor being turned on, wherein the pixel circuit includes:

a third transistor in the current path between the first power source and the OLED, the third transistor to control the amount of current supplied to the OLED based on a voltage applied to the first node;

a fourth transistor coupled between a first electrode of the third transistor and a data line, the fourth transistor to turn on when the scan signal is supplied to the i-th scan line; and a fifth transistor coupled between a second electrode of the third transistor and the first node, the fifth transistor to turn on when the scan signal is supped to the i-th scan line.

10. The device as claimed in claim 9, further comprising:

a first capacitor coupled between the gate electrode of the at least one first transistor and the first power source, the first capacitor to store the emission control signal.

11. The device as claimed in claim 9, wherein the at least one first transistor includes a plurality of transistors including:

a primary first transistor coupled between the first power source and the pixel circuit; and a secondary first transistor coupled between the pixel circuit and the OLED.

12. The device as claimed in claim 9, wherein:

the second transistor is to turn off when the respective one of the data signals correspond to a black gray scale value, and the second transistor is to be turned on when the respective one of the data signals corresponds to a gray scale value different from the black gray scale value.

13. The device as claimed in claim 9, wherein the scan driver is to supply the i-th emission control signal to the i-th emission control line to overlap the scan signals supplied to the (i−1)-th and i-th scan lines.

14. The device as claimed in claim 13, wherein the pixel circuit further includes:

a sixth transistor coupled between the first node and an initialization power source, the sixth transistor to turn on when the scan signal is supplied to the (i−1)-th scan line; and a second capacitor coupled between the first node and first power source.

15. The device as claimed in claim 14, wherein a gate electrode of the second transistor is coupled to the first node.

16. The device as claimed in claim 14, wherein the initialization power source is set to a voltage lower than the data signal.

* * * * *